United States Patent [19]
Wellerdieck

[11] Patent Number: 5,460,707
[45] Date of Patent: Oct. 24, 1995

[54] ETCHING OR COATING METHOD AND A PLANT THEREFOR

[75] Inventor: Klaus Wellerdieck, Buchs, Switzerland

[73] Assignee: Balzers Aktiengesellschaft, Balzers, Liechtenstein

[21] Appl. No.: 250,356

[22] Filed: May 27, 1994

Related U.S. Application Data

[63] Continuation of Ser. No. 107,904, Aug. 17, 1993, abandoned, which is a continuation of Ser. No. 729,633, Jul. 15, 1991, abandoned.

[30] Foreign Application Priority Data

Jul. 17, 1990 [DE] Germany .......................... 40 22 708.1

[51] Int. Cl.⁶ .............................. C23C 14/34; B44C 1/22
[52] U.S. Cl. ........................ 204/298.08; 204/298.06; 204/298.11; 204/298.15; 204/298.31; 156/345
[58] Field of Search ................ 204/192.12, 192.32, 204/298.06, 298.08, 298.15, 298.31, 298.11, 298.34; 156/345

[56] References Cited

U.S. PATENT DOCUMENTS

| | | | |
|---|---|---|---|
| 4,132,613 | 1/1979 | Penfold et al. | 204/192 R |
| 4,166,018 | 8/1979 | Chapin | 204/192 R |
| 4,209,357 | 6/1980 | Gorin | 204/298.33 X |
| 4,278,528 | 7/1981 | Kuehnle et al. | 204/298 |
| 4,367,114 | 1/1983 | Steinberg et al. | 156/345 |
| 4,397,724 | 8/1983 | Moran | 204/298.31 X |
| 4,399,016 | 8/1983 | Tsukada et al. | 204/298.31 X |
| 4,400,235 | 8/1983 | Coquin et al. | 204/298.31 X |
| 4,419,201 | 12/1983 | Levinstein et al. | 204/298.31 X |
| 4,466,872 | 8/1984 | Einbinder | 204/192 R |
| 4,473,437 | 9/1984 | Higashikawa et al. | 204/298.31 X |
| 4,491,496 | 1/1985 | Laporte et al. | 204/298.31 X |
| 4,552,639 | 11/1985 | Garrett | 204/298 |
| 4,557,819 | 12/1985 | Meacham et al. | 204/298 |
| 4,572,759 | 2/1986 | Benzing | 156/345 |
| 4,579,618 | 4/1986 | Celestino et al. | 204/298.34 X |
| 4,581,118 | 4/1986 | Class et al. | 204/298 |
| 4,600,464 | 7/1986 | Desilets et al. | 204/298.34 X |
| 4,632,719 | 12/1986 | Chow et al. | 156/345 |

(List continued on next page.)

FOREIGN PATENT DOCUMENTS

| | | |
|---|---|---|
| 0115970 | 3/1984 | European Pat. Off. . |
| 0271341 | 12/1987 | European Pat. Off. . |
| 0296419 | 10/1988 | European Pat. Off. . |
| 1790178 | 9/1968 | Germany . |
| 2022957 | 5/1970 | Germany . |
| 3706698 | 3/1987 | Germany . |
| 59-139629 | 8/1984 | Japan . |
| 1111910 | 12/1965 | United Kingdom . |
| 1258301 | 3/1969 | United Kingdom . |
| 1358411 | 7/1974 | United Kingdom . |
| 1569117 | 11/1976 | United Kingdom . |
| 1587566 | 7/1977 | United Kingdom . |
| 2157715 | 4/1985 | United Kingdom . |

OTHER PUBLICATIONS

"Application of RF Discharges to Sputtering" Koenig & Maissel; IBM J. Res. Develop.; Mar. 1970, pp. 168–171.
Balzers Pub. #BB 800015DD (8404), K. Hofler and K. Wellerdieck, pp. 1–8.
"Die PotentialVerteilung in Hochfrequen 2 Gasentladungen Der Zerstäubungstechnik"; K. Wellerdieck; 1988: pp. 3, 5–7: 14, 15, 36, 37, 54–57, 60–63, 135, 136; 142 & 143.

Primary Examiner—Nam Nguyen
Attorney, Agent, or Firm—Louis Weinstein

[57] ABSTRACT

An etching or coating plant has a vacuum recipient and a pair of electrodes located at a distance from each other and adapted to produce a capacitive plasma discharge in the recipient. The wall structure encasing the recipient is divided into two parts which are insulated from each other and which both serve for the electric signal transmission to their surfaces located at the inside and acting as electrode surfaces whereby by means of the division of the wall structure of the recipient it will be controlled which of the electrodes is eroded and which one is coated, respectively. Disclosed is further a method of igniting plasma discharges and the intermittent operation thereof.

9 Claims, 2 Drawing Sheets

U.S. PATENT DOCUMENTS

| | | | |
|---|---|---|---|
| 4,657,619 | 4/1987 | O'Donnell | 156/345 |
| 4,808,258 | 2/1989 | Otsubo et al. | 204/298.34 X |
| 4,818,359 | 4/1989 | Jones et al. | 204/298.06 |
| 4,844,775 | 7/1989 | Keeble | 204/298.34 X |
| 4,968,374 | 11/1990 | Tsukada et al. | 204/298.31 X |
| 4,999,096 | 3/1991 | Nihei et al. | 204/298.06 X |
| 5,006,760 | 4/1991 | Drake, Jr. | 315/111.21 |

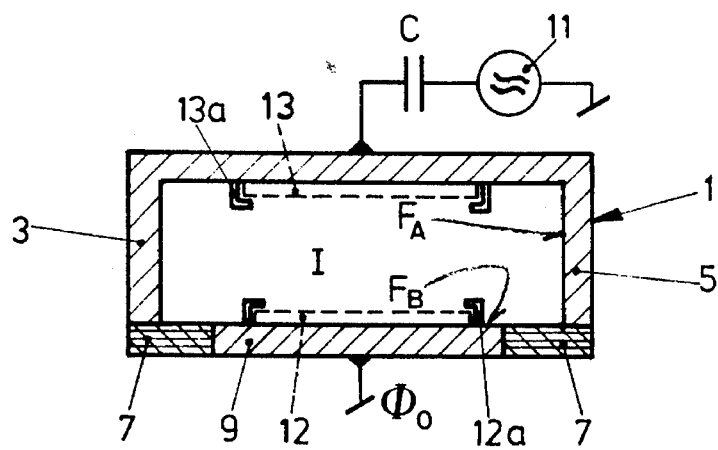
FIG. 1
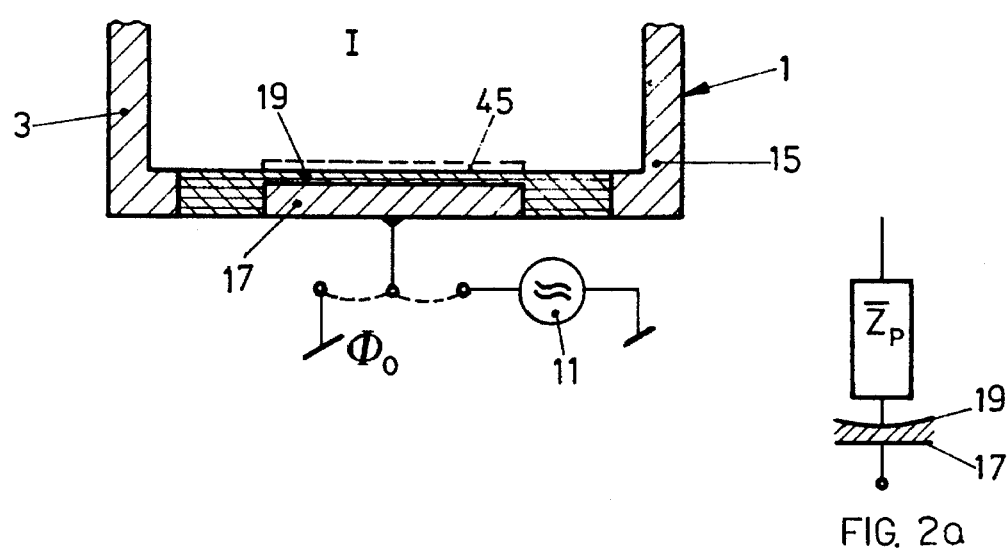
FIG. 2
FIG. 2a
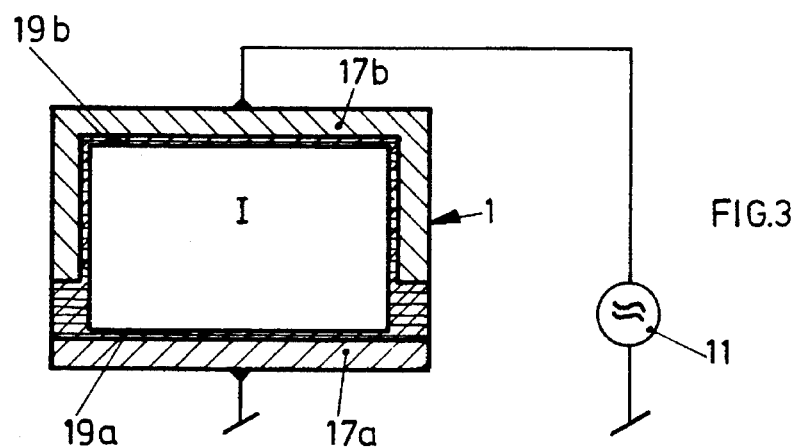
FIG. 3

ETCHING OR COATING METHOD AND A PLANT THEREFOR

This application is a continuation of Application Ser. No. 08/107,904, filed Aug. 17, 1993 abandoned, which is a continuation of Application Ser. No. 07/729,633, filed Jul. 15, 1991, now abandoned.

BACKGROUND OF THE INVENTION

1. Field of the Invention

The present invention relates to etching or coating plants for purely physical processes and also for plasma supported chemical processes PECVD as well, having a vacuum recipient and a pair of electrodes located at a distance from each other and adapted to capacitively produce an AC-plasma discharge in the recipient; it relates further to a method of igniting plasma discharges and to a method of intermittently operating same.

2. Description of the Prior Art

Sputtering plants of the mentioned kind or of a similar kind are disclosed in the following patent documents: DE-OS 1 790 178, DE-OS 2 022 957, DE-OS 3 706 698, EP-A-0 271 341, U.S. Pat. Nos. 4,572,759, 4,278,528, 4,632,719, 4,657,619, 4,132,613, 4,557,819, 4,466,872, 4,552,639, 4,581,118, 4,166,018, GB-A-1 587 566, 1 569 117, 1 358 411, 1 111 910, 1 258 301, 2 157 715. It is, thereby, a general procedure to either operate both electrodes for the capacitive excitation of the plasma such as for instance disclosed in EP-A-0 271 341 electrically through insulating feed-through entrances through the wall of the recipient or to use merely one of the electrodes this way and the entire wall of the recipient as a second electrode, for instance and specifically to connect it as an "anode" to ground.

With regard to the physics of the so-called AC- or especially Rf-sputtering technique attention is drawn to H. R. Koenig and L. I. Maissel, IBM J. Res. Develop. 14, Mar. 1970, p. 168, further to the technical publication BB 800 015 DD (8404) of the Balzers Company, K. Hoefler and K. Wellerdieck, and to the thesis of K. Wellerdieck "Die Potentialverteilung in Hochfrequenz-Gasentladung der Zerstäubungstechnik" (The distribution of the potential in the Rf-gas discharge of the sputtering technique), 1988, University of Karlsruhe.

The procedures which have been used up to now, namely to operate either both electrodes or also only one which is electrically insulated from the wall structure of the recipient, via feed-through entrances through the wall structure of the recipient feature the following drawbacks:

They cause the necessity of providing at least one vacuum tight insulating feed-through through the wall structure of the recipient. Furthermore, the at least one electrode set off from the wall structure of the recipient blocks a relatively large part of the process space and, therefore, the recipient is relatively voluminous.

If the electrical supply of one of the electrodes is fed vacuum tight and insulated through the wall structure of the recipient and this wall is operated in its entirety as a second electrode, e.g. connected to earth potential, the design regarding the selection of the ratio of the surfaces of the electrodes which face towards the inner side of the recipient is extremely curtailed. Usually, the electrode which then is formed by the complete wall structure of the recipient is regarding its surface substantially larger than such of the electrode with the feed-through through the wall structure.

Since a workpiece to be etched must be located at the smaller one of the electrodes (surface/voltage law of Koenig), thus, in this case at the mentioned electrode with the feed-through, and since generally AC-potential is applied to this electrode and not to the housing of the recipient or the wall structure of the recipient, it is necessary to apply in this case the workpiece to be etched on an electric potential. Thereby, it rests not only on an AC-potential, because it is this smaller electrode which, due to the discharge, develops also a DC-potential (self-bias potential). A workpiece connected to voltage (on the smaller electrode with feed-through, wall of recipient connected to reference potential) is substantially more cumbersome regarding any kind of automatic handling.

In summarizing it therefore can be stated that an electrode located in the inside of the recipient, separated locally from the wall of the recipient and operated electrically insulated from aforementioned wall, occupies space which must be considered when designing the recipient, necessitates further a vacuum tight lead-in or feed-through through the wall of the recipient, and that finally by such an electrode the flexibility regarding the allocations of large/small surfaces of the electrodes (Koenig) reference potential/DC-floating potential are curtailed.

SUMMARY OF THE INVENTION

A general object of the present invention is to provide a plant of the kind mentioned above by means of which the mentioned drawbacks are eliminated and a design is provided which is as compact as possible.

A further object is to provide an etching or coating plant in which the recipient has a wall structure enclosing same and is divided into two parts which are insulated from each other, both parts adapted to electrically transmit signals to their inner surfaces which serve as electrode surfaces, whereby by means of the division of the wall structure of the recipient a co-controlling of which of the electrodes is eroded and which one thereof is coated, is established.

Because the housing of the recipient i.e. its wall structure forms both electrodes, at the one hand the providing for the inner space of the recipient which is needed for one of the electrodes is no longer necessary, the insulated lead-in is also no longer necessary, and additionally, due to the mentioned dividing of the wall structure, it is possible to selectively design the ratio of the surfaces of the electrodes regarding their size without curtailing substantially the structural volume of the recipient.

A further object is to provide a plant in which at least one of the electrodes is formed by at least one surface capable of transmitting i.e. conducting electrons located outside relative to the inside of the recipient and by at least one dielectric stratum e.g. layer or plate located subsequently e.g. adjacent towards the inside. By such design the vacuum lead-in at the mentioned one electrode is again abolished. Such an electrode forms part of the wall structure and can, furthermore, be designed directly as a capacitive, DC-potential decoupled electrode, without that hereto a discrete decoupling capacitance must be connected in series thereto.

The provision of a dielectric stratum located facing towards The inside causes regarding a direct current conducting path with the electron-conducting surface located at the outside a DC-decoupling of the discharge space. It is, thus, possible to utilize an arbitrary part of the surface of the wall structure of the recipient as such a "capacitive" electrode surface, wherewith also here an as large as possible flexibility for a selected design of the plant at a heeding of the law of Koenig is arrived at.

In a way which is different from the disclosure of the U.S. Pat. No. 4,572,759 the dielectric layer is not operated as a protective layer which is consumed during the process and forms volatile reaction products, but is rather operated as substantial, capacity forming layer.

A further object is to provide a plant in which the dielectric stratum is freely exposed towards the inside. The advantage of such a design is as follows: As is generally known, the ratio between eroding (etching) and coating is determined as has been mentioned above by the ratio of the surfaces of the electrodes. The larger the ratio of the surface of the one of the electrodes relative to the other one of the electrodes is, the less the larger electrode is eroded or etched off, respectively, and the less the smaller electrode is coated. It is here, however, always a matter of a balance of the effects, the larger one of the two electrodes is thereby always eroded, too.

If now a workpiece is to be etched and if it thus is arranged at the area of the smaller electrode the erosion of the larger electrode which cannot be prevented completely leads to an interference coating of the workpiece to be etched.

Also, if a workpiece is coated and thus is arranged at the area of the larger electrode in order to be coated by eroded material arranged in an area of the smaller electrode, interference coating is possibly formed by the erosion or sputtering-off, respectively also of the larger electrode.

These interferences are detrimental in such cases where the materials taking part thereat do not conform to the process, i.e. at the one hand if at a material to be coated the interference coating from the larger electrode does not proceed with a material which e.g. is the same as that of the substrate of the workpiece or the desired coating material, and at the other hand, at a workpiece to be etched, if the interference material from the larger electrode does e.g. not proceed with the material of the substrate of the workpiece. Since now, in accordance with the above mentioned object of the invention to provide a plant in which the dielectric stratum is freely exposed towards the inside, this electrode stratum located at the inside can be selected from a dielectric material and, therefore, it is possible without any further ado to select as such a dielectric material a material which corresponds to the substrate of the workpiece or a material which does not disturb the process of the treatment or its result, respectively for instance $SiO_2$ at a substrate or workpiece, respectively of $SiO_2$ or having a $SiO_2$-surface.

It is now quite obvious that one or two electrodes formed in accordance with an object of the invention stated above relating to at least one of the electrodes being formed by at least one surface capable of electron-conductance located outside relative to the inside of the recipient and by at least one subsequently towards the inside located dielectric stratum, one or both electrodes can form a plant structured in accordance with the initially stated general object of the invention.

In case of at least one electrode being embodied as set forth in the preceding paragraph it is a further object of the invention to provide a plant in which the electron-conducting surface is formed by a part of the wall structure of the recipient made of metal and adapted to absorb the loading caused by the vacuum. It is, hereby, taken into consideration that dielectric materials are only able to absorb mentioned large loading over a large area, when the layer has a considerable thickness, and that their specific capacity decreases at an increasing thickness. Accordingly it is sought in many cases to use dielectric layers which are as thin as possible, e.g. to be in a position to transmit with losses which are as low as possible an as large as possible AC-energy into the process space.

Still a further object is to provide a plant comprising a support for a workpiece to be etched and located at lease closer to one of the electrodes, of which electrode the surface facing the inner space of the recipient is substantially smaller than such of the other electrode, and vice versa for a workpiece to be coated. Here, the teaching of the law of Koenig is consequently utilized.

It is, furthermore, known that in case of a capacitive generation of plasma one of the electrodes must be operated via a discrete capacitance, uncoupled regarding DC-potential or free floating, respectively in order that a self-bias potential can arise thereat.

Yet a further object is to provide a plant in which at least one electrode is of a double layer or sandwich like structure whereby at least one layer of metal absorbs the mechanical loading of the wall structure of the recipient due to the vacuum. The following is thereby reached:

If this electrode is formed by a metal surface located at the outside and a dielectric stratum which is freely exposed towards the inside, the outer metal surface, the adjacent dielectric stratum and the there bordering process space with free charge carriers form a capacitance equivalent to known electrodes made of metal having there discrete capacitance connected in series. The electrode structured in accordance with the invention assumes additionally the duty of the DC-decoupling capacitance.

A further object is to provide a plant in which the inner wall of the recipient consists at least to the larger part of a dielectric material. If now accordingly the entire inner surface of the recipient is formed of a dielectric material which is selected to suit the workpiece and process, the above discussed danger of a contamination is completely eliminated.

In many cases not the entire surface of the wall structure of the recipient is utilized as electrode surface. Therefore, it is a further object of the invention to provide a plant in which a section of the wall structure of the recipient located between the electrodes comprises a dielectric stratum located towards the inner space of the recipient.

It is thereby possible in accordance with a further object of the invention to provide a plant in which a section of the wall structure is designed between the electrodes with such a thickness such that the wall structure of the recipient consists there of such dielectric stratum. This because no electrical energy must be transmitted in such intermediate sections.

In order now to increase the density of the plasma whereby it until now has been described that this plasma is produced capacitively, and at the same time to reduce the ion energy, it is a further object of the invention to provide a method in which a coil arrangement is located at the section of the wall structure which comprises a dielectric stratum located towards the inner space of the recipient for an inductive energy coupling into the plasma between the electrodes. The mentioned dielectric intermediate section is extremely suitable for this task, because the provision of a coil arrangement for the production of an inductive field in the inside of the recipient necessitates absolutely a design of the section of the wall structure between the coil and the inside of the recipient which is dielectric, or then to arrange the coil to be exposed freely against the inside of the recipient.

When taking, furthermore, into consideration that the intended coil arrangement is an electron-conducting arrangement having a surface facing towards the inside of the recipient, it is recognized that such a coil arrangement having a towards the inside of the recipient adjacent dielectric layer or stratum, respectively forms the same structure as mentioned earlier as an object of the invention, namely to provide a plant in which at least one of the electrodes is formed by at least one surface capable of electron-conductance located outside relative to the inside of the recipient and by at least one subsequent towards the inside located dielectric stratum, or then, alternatively, if freely exposed against the inside of the recipient, forms a part of the wall structure made of metal.

Thus, it is possible without any further ado in order to achieve the mentioned flexibility regarding the selection of the ratio of the surfaces to connect the coil galvanically to one of the electrodes for a capacitive production of plasma, and in case of an electrode in accordance with the invention structured in accordance with the above last stated object of the invention, whereby the surface of the coil facing towards the inside of the recipient contributes to the surface of this electrode.

A further object is to provide a plant in which the coil arrangement absorbs at least a substantial part of the loading of the wall structure of the recipient due to the vacuum. It is quite simply possible to form the coil winding around the recipient by a flat band or web, respectively material by means of which a high mechanical stability relative to radial loading forces is achieved and also a large surface facing the inside of the recipient.

In view of the general object of the invention it also can be seen that if the additionally provided coil arrangement is also used as surface of the capacitive electrode, the provision of the coil arrangement must not additionally increase the structural height of the recipient.

Still a further object of the invention is to provide a method of igniting a plasma discharge in a vacuum recipient wherein initially a plasma is produced capacitively between the electrodes and thereafter additionally is inductively amplified. Such an ignition method is obviously quite suitable for the igniting of the plant as explained above without any further supplemental ignition procedures.

Yet a further object is to provide a method for intermittent operating of a plasma discharge in a vacuum recipient, according to which in order to stop the process the electrodes located at a distance from each other and adapted to capacitively produce a plasma are deactivated electrically and the plasma is thereby maintained inductively, and wherein in order to restart the treatment process the electrodes adapted to capacitively produce a plasma are again activated electrically.

By means of such it is made possible, that by means of the inventive igniting or inventive intermittent operation, respectively, preferably operated in combination, to operate the plant without any specially installed ignition device and to operate the plant intermittently.

A further object is to provide an etching or coating plant having a pair of electrodes located at a distance from each other and adapted to produce capacitively a plasma, and having a coil arrangement for an inductive energy coupling into the plasma, in which the coil arrangement is galvanically connected to one of the two electrodes adapted to produce capacitively a plasma and thus the surface of the coil arrangement facing the plasma acting as surface of said electrode adapted to produce a plasma capacitively. By means of such it is basically possible to utilize the dimensions of the structure of the recipient better or to reduce, respectively the dimensions thereof.

BRIEF DESCRIPTION OF THE DRAWINGS

The invention will be better understood and the above objects as well as objects other than those set forth above will become apparent when consideration is given to the following detailed description thereof. Such description makes reference to the annexed drawings wherein:

FIG. 1 illustrates schematically an etching or coating, respectively plant structured in accordance with the invention, in which the recipient forms both electrodes for a capacitive production of a plasma;

FIG. 2 illustrates schematically based on a cut-out of a recipient the design of one of the electrodes for a capacitive production of the plasma in accordance with a second inventive solution;

FIG. 2a is an equivalent electric circuit useful to explain the recipient of FIG. 2;

FIG. 3 illustrates schematically a recipient of a plant, in which both electrodes for the capacitive production of a plasma are designed in accordance with the embodiment of FIG. 2, and where additionally the recipient in accordance with FIG. 1 is formed substantially by an electrode surface;

DESCRIPTION OF THE PREFERRED EMBODIMENTS

Figure 4:
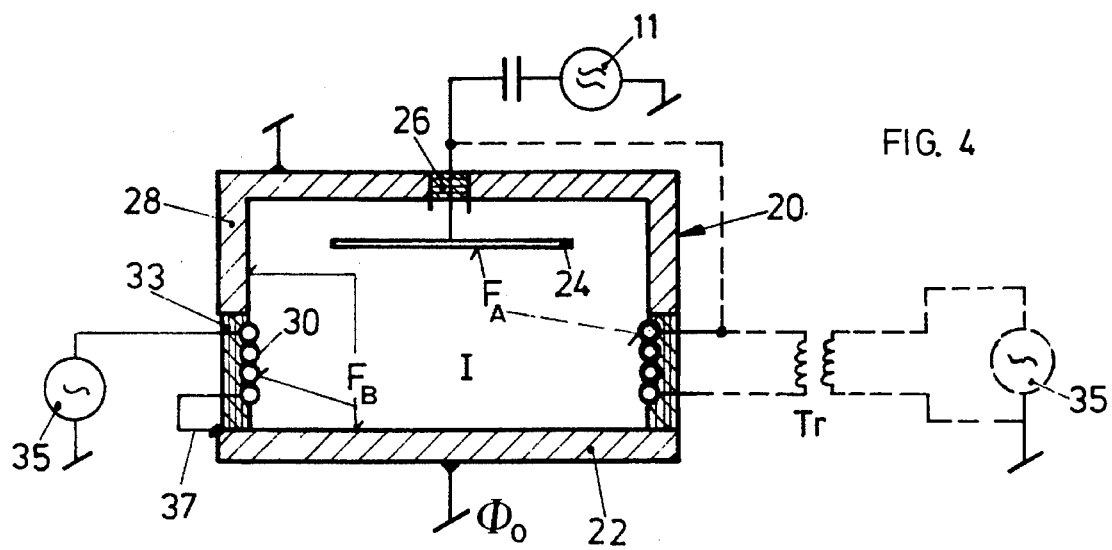
FIG. 4 illustrates, proceeding from a known recipient of a plant having electrodes for a capacitive production of the plasma, the further development or embodiment, respectively having a coil arrangement for an inductive feeding of energy into the plasma, whereby in accordance with the invention the surface of the coil arrangement is utilized as part of the surface of one of the electrodes for a capacitive production of the plasma.

FIG. 1 illustrates schematically a vacuum recipient. Its wall structure 3 which encases the inner space I of the recipient and to which obviously and not specifically illustrated in this figure vacuum pumps, gas inlets for the operating gas such as Argon and/or for a reactive gas, etc. are connected includes a first part 5 of metal and, separated therefrom by an intermediate insulator 7, a second part 9 of metal. The parts 5 and 9 made of metal form each one of the two electrodes for the capacitive production of a plasma.

The upper pare 5, for instance, is connected via a decoupling capacitance C to an Rf-generator 11, generally an AC-generator, while in the illustrated example the second part 9 acting an electrode is applied to a reference potential φo, for instance to earth potential. The inner wall of part 5 forms the one electrode surface $F_A$ while the inner wall of the part 9 forms the second electrode surface $F_B$ which faces the process chamber or inner space I, respectively of the recipient.

It can be seen that in the case of this design of the recipient 1 there is the largest flexibility regarding how the ratio of the two surfaces $F_A$ to $F_B$ shall be selected. For an etching, a workpiece is placed such as illustrated at 12 by broken lines onto the electrode part 9, i.e. on that part which forms the substantially smaller electrode surface $F_B$, while in case of a coating, the workpiece such as illustrated by 13 is placed onto the electrode part 5 which sets a substantially larger electrode surface $F_A$. In the latter case the reference potential φo is preferably applied to the larger electrode, thus here the part 5.

FIG. 2 illustrates a second inventive arrangement of the plant or recipient, respectively.

The recipient 1, of which only a part is shown in this illustration and having for instance a wall structure 15 of metal is structured with a first electrode for a capacitive production of plasma (not shown) which can be a part of the wall structure of the recipient in accordance with the concept of FIG. 1, or, however, may be an electrode which is operated in accordance with a known technique by means of a vacuum tight lead-in insulated through the wall structure of the recipient. FIG. 2 illustrates an electrode or second electrode designed in accordance with the invention. It includes in its basic structure a layer 17 of metal which is electro-conductive and which is located at the outside relative to the inner space I of the recipient and separated from same by a stratum 19 of a dielectric material.

In order to absorb the loading of the wall structure 3 of the recipient due to the vacuum present in the inner space I of the recipient, the layer 17 which is electro-conductive is preferably designed relatively thick such that the mentioned loading is absorbed by this layer 17. The dielectric stratum 19 can in such a case be designed arbitrarily thin. The inventive electrode at the vacuum recipient which regarding its basic structure is formed by the electro-conductive layer 17 located at the outside and the dielectric stratum forms a DC-decoupling capacitance as follows:

Free charge carriers are present in the process space where the plasma is maintained. Therefore, the process space which contacts at the inside the dielectric stratum 19 forms an opposite capacitor surface relative to the layer 17. In a simplified manner the arrangement of the electro-conductive layer 17, the dielectric stratum 19 and the adjacent process space can be presented such as shown in FIG. 2a by a process impedance $\bar{Z}_p$ and the electrode capacitance connected thereto in series for DC-components formed by the dielectric stratum 19 and the electro-conductive layer 17.

Such as shown as an alternative arrangement in FIG. 2, the reference potential φo is applied to this electrode for a capacitive production of a plasma or, according to a further alternative, is connected to the AC and specifically Rf-generator 11. The DC-decoupling capacitance C which must be present in an arrangement in accordance with FIG. 1 to allow the electrode part 5 to assume the self-bias potential is formed by the mentioned capacitance between the layer 17 and the process chamber I.

The dielectric layer 19 is preferably produced of a material which is compatible with the treatment process of a workpiece and specifically in the sense that an eroding of this material of the layer does not negatively influence the results of the treatment or process, respectively. Therefore, if a workpiece having a $SiO_2$-surface is treated the layer is preferably made of $SiO_2$.

The electrode illustrated based on FIG. 2 may be applied over arbitrarily large areas of the wall structure 3 of the recipient, wherewith also here a large flexibility exists regarding selecting of the ratio between large electrode surface and small electrode surface.

FIG. 3 illustrates as example a recipient 1 structured in accordance with the invention in which both electrodes for a capacitive production of a plasma are designed according to the kind illustrated in FIG. 2. It can be seen that by such design there is the possibility to structure in a selective manner the entire inside of the recipient and meeting the highest demands regarding purity of a dielectric material which is compatible with the process.

FIG. 4 illustrates schematically a recipient 20 where a reference potential φo, for instance ground or earth potential is applied to the parts 22 and 28 according to known techniques. The part 22 acts as the one of the electrodes for a capacitive production of a plasma. The second electrode 24 used for this task is operated as generally known via a lead-in insulator 26 through the metal wall 28 of the recipient 20. A coil arrangement 33 extending around the recipient is located in an intermediate section 30 of the wall structure of the recipient. The coil is connected to an AC-generator 35 which delivers the power to the coil. Due to action of the magnetic induction field generated by the coil 33 in the inner space I of the recipient or in the process space respectively between the electrodes 24 and 22/28 the density of the plasma is increased, the ion energy decreased such that a more smooth and "gentle" coating or etching, respectively of a workpiece is possible in comparison with a treatment by means of an only capacitively produced plasma.

Now, in accordance with the illustration of FIG. 4, the inner surface of the coil arrangement 30 is in accordance with the invention freely exposed towards the inner space I of the recipient. The AC-generator 35 for the supply of the power to the coil is connected in series to the vacuum tight encapsulated coil 33, thereafter to the part 22 of the recipient which aces as one of the electrodes, and the reference potential φo is thus applied to the latter part wherewith the surface of the coil which is freely exposed towards the inside becomes part of the electrode surface of the part 22 of the recipient. By means of this it is possible to design the recipient in spite of the provision of a coil arrangement 33 substantially in a compact manner as if no coil arrangement 33 would be present and this at a given ratio of the electrode surfaces $F_A$, $F_B$.

If the coil 33 is not operated galvanically connected to the part 22 to which the reference potential is applied or to the electrode to which the reference potential is applied, respectively the coil 33, such as illustrated by broken lines at the right-hand side of FIG. 4, is connected for instance via a transformer Tr to the AC-generator 35 and is galvanically connected to the electrode 24. By means of such the coil 33 can at the one hand also assume the self-bias potential and is operated by the generator 11 coupled via a transforming means to the operating generator 35.

In this case the coil 33 adds to the surface of the electrode 24 for the capacitive generation of the plasma.

Figure 5:
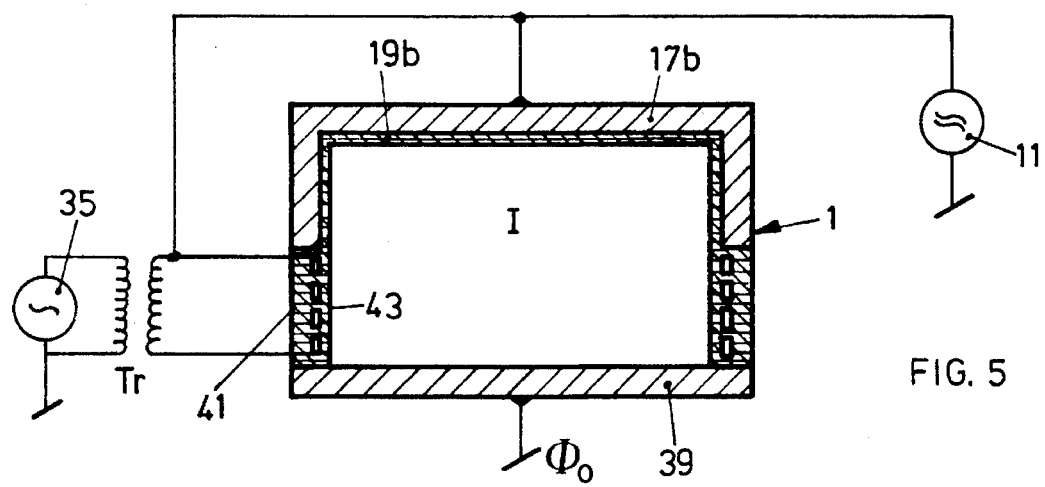
FIG. 5 illustrates schematically a recipient of the plant in accordance with the present invention with one of the electrodes for the capacitive production of a plasma structure in accordance with FIG. 2, and with a coil arrangement whereby the surface of the coil arrangement forms part of the electrode according to FIG. 2.

In FIG. 5 the technique disclosed based on FIG. 4, regarding utilizing of the surface of a coil provided for an inductive production of a plasma is applied together with the design of at least one of the electrodes for a capacitive production of a plasma in accordance with FIG. 2. In the illustrated example one of the electrodes for a capacitive production of a plasma is formed by a part 39 of metal of the recipient. Again, e.g. reference potential φo is applied to this part. The second electrode for a capacitive production of a plasma is formed similar to the embodiment according to FIG. 2 by an electro-conductive layer 17b, a part made of metal, having a dielectric stratum 19b exposed to or facing, respectively the inner space I of the recipient. The metal layer 17b is in accordance with the statement regarding the configuration of the circuit of an electrode according to FIG. 2 connected to the AC-generator without any further DC-decoupling capacitor.

A coil arrangement 41 is located in an area 43 of the recipient, covered against the inner space I of the recipient by a dielectric material such as by an extending of the dielectric stratum 19b. Because in the example disclosed here the coil 41 shall act by means of its surface facing the inner space of the recipient as an enlargement of the surface formed by the part 17b, the coil 41 is connected via a separating transformer Tr to the AC-generator 35 and is, furthermore, galvanically connected to the part 17b.

Preferably, the body of the coil 41 absorbs the mechanical loading due to the vacuum at the area 43 and is structured as a flat band winding such as illustrated schematically in order to provide an as large as possible active surface which faces towards the inside of the recipient.

Reviewing the inventive design of the electrode according to FIG. 2 it can be stated that this arrangement can also include a third layer of metal facing towards the inside of the recipient in case it is preferred to have a wall structure of metal facing the inner space of the recipient. It can, thereby, be seen that such a layer of metal illustrated at 45 by broken lines or a corresponding metal body may be easily exchanged depending on a respective desired material such to suit a respective process.

An arrangement having a vacuum recipient, a pair of electrodes for a capacitive production of a plasma and additionally a coil arrangement for an inductive production of a plasma such as basically illustrated in FIG. 4, but independently from the specific utilization disclosed based on FIG. 4 is ignited in accordance with the invention in that initially the plasma is built up capacitively and is increased thereafter inductively. That is, for instance in case of the embodiment illustrated in FIG. 4, in order to ignite, the AC-generator 11 is first set into operation and thereafter the AC-generator 35 which supplies the power for the coil.

For an intermittent operation of the etching or coating process made in the recipient the procedure is for stopping the process to first disable the capacitive production of the plasma, i.e. when reviewing the example of FIG. 4 to stop the AC-generator 11, whilst the generator 35 which supplies the coil energy remains electrically activated. In order to restart the process merely the capacitive portion is put back into operation by restarting the generator 11 while the inductive portion has remained active.

It has been mentioned that a workpiece to be treated at the inventive recipient is located in case it is to be etched at the area of the electrode having the smaller surface facing the inner space of the recipient for which task in this case a supporting device for workpieces to be etched is arranged at the area of this smaller electrode. Such a support is schematically illustrated in FIG. 1 by 12a.

In a similar procedure a support for a workpiece to be coated is arranged at the electrode having the larger surface such as schematically illustrated in FIG. 1 by 13a.

It is quite obvious that also here it is possible to bring a magnetic field to act in the discharge space in accordance with known procedures in order to obtain a locally controlled increase of the density of the plasma or control, respectively of the distribution of the plasma. Such a field is then preferably produced by permanent and/or electro-magnets located outside of the chamber and mounted stationary or displaceably.

While there are shown and described presently preferred embodiments of the invention it is to be distinctly understood that the invention is not limited thereto, but may be otherwise variously embodied and practised within the scope of the following claims.

I claim:

1. A vacuum etching or coating apparatus comprising an enclosure having a hollow interior space to be evacuated, said enclosure being substantially formed by a top, a bottom and a side wall section; said enclosure having an inner surface which predominantly borders said interior space and an outer surface predominantly exposed to an ambient, said inner surface defined by top and bottom surfaces which are substantially flat and do not protrude into said interior space defined by the side wall and upper and lower ends thereof, joined by a side wall surface; said enclosure of said apparatus being formed by two electro-conductive enclosure portions electrically insulated from one another by a dielectric spacer, an extent of said dielectric spacer contributing to said inner surface of said enclosure only by an amount sufficient to electrically isolate said two electro-conductive enclosure portions from one another, the surfaces of said conductive enclosure portions exposed to said interior space defining a pair of electrodes electrically separated from each other; the entire interior surface of said electrode comprised of said conductive enclosure portions being covered by a thin dielectric layer, said dielectric layer forming a capacitance creating an RF electric signal transmitting element from RF plasma discharge between said inner surfaces of said two conductive portions forming said electrode surfaces.

2. The apparatus of claim 1, in which said conductive enclosure portions are made of metal and are of a thickness sufficient to withstand loading due to a vacuum created in said interior space and due to ambient pressure acting along said outer surfaces of said conductive enclosure portions.

3. The apparatus of claim 1, comprising a support for a workpiece to be treated and located close to an inner surface of one of said conductive enclosure portions, said inner surface of said one of said portions being substantially smaller than an inner surface of the other of said portions.

4. The apparatus of claim 1, comprising a support for a workpiece to be coated, located close to an inner surface of one of said conductive enclosure portions, said inner surface of said one of said portions being substantially larger than an inner surface of the other of said portions.

5. The recipient of claim 1, in which at least one of said conductive enclosure portions is of a sandwich-like structure of electro-conductive and dielectric layers.

6. The apparatus of claim 1, in which a coil arrangement is located along said dielectric spacer for providing an inductive energy coupling into said interior space.

7. The apparatus of claim 6, in which said coil arrangement is galvanically connected to one of said electro-conductive enclosure portions to add to and thereby increase an electro-conductive surface of said one of said electro-conductive enclosure portions.

8. The apparatus of claim 7, wherein said coil arrangement increases supporting strength of the dielectric spacer by absorbing at least a substantial part of loading of said dielectric space which is due to a pressure difference between said interior space and the outer surface of said enclosure.

9. The apparatus of claim 6, wherein said coil arrangement is embedded in said dielectric spacer.

* * * * *